United States Patent [19]

Berbel

[11] Patent Number: 5,733,378
[45] Date of Patent: Mar. 31, 1998

[54] METHOD FOR CLEANING PRINTED CIRCUIT BOARDS

[75] Inventor: Jose Berbel, Austin, Tex.

[73] Assignee: Austin American Technology, Austin, Tex.

[21] Appl. No.: 606,591

[22] Filed: Feb. 26, 1996

[51] Int. Cl.⁶ .................................................. B08B 7/04
[52] U.S. Cl. ........................... 134/10; 134/34; 134/42
[58] Field of Search ........................ 134/10, 12, 13, 134/34, 38, 40, 109, 111, 191; 510/175, 407

[56] References Cited

U.S. PATENT DOCUMENTS

| | | | |
|---|---|---|---|
| 3,551,204 | 12/1970 | Bolger et al. | 134/38 |
| 3,930,879 | 1/1976 | Erickson et al. | 134/10 |
| 4,017,343 | 4/1977 | Haas | 134/109 |
| 4,201,664 | 5/1980 | Hekal | 134/10 X |
| 4,592,787 | 6/1986 | Johnson | 134/38 |
| 5,164,093 | 11/1992 | Chilton et al. | 210/688 |
| 5,339,844 | 8/1994 | Stanford, Jr. et al. | 134/109 X |
| 5,486,314 | 1/1996 | Wack et al. | 510/163 |
| 5,571,420 | 11/1996 | Creeron et al. | 210/665 |

*Primary Examiner*—Jill Warden
*Assistant Examiner*—Saeed Chaudhry
*Attorney, Agent, or Firm*—David G. Henry

[57] ABSTRACT

The invention is of a methodology for cleaning electronic components, particularly of contaminants which remain after soldering of printed circuit boards. The novel methodology uses a uniquely effective, and heretofore unused solvent which is environmentally benign, lends itself to serving as a measurable indicator of board cleanliness as it cleans, and can be, according to the methodology, regenerated to conserve solvent.

4 Claims, No Drawings

METHOD FOR CLEANING PRINTED CIRCUIT BOARDS

BACKGROUND OF THE INVENTION

1. Field of the Invention

Applicant's invention relates to electronic manufacturing processes, and more particularly to the printed circuit board cleaning step which follows the soldering of electronic components onto a circuit board.

2. Background Information

During the assembly of components on printed circuit wiring boards, soldering fluxes are first applied to the substrate board material to insure that the solder will firmly bond the components to the wiring traces imprinted on the printed circuit board. After soldering, remaining flux residue must be removed. Ionic contamination (both positive and negative ions) can cause corrosion if not removed from the printed circuit board.

The flux chemistry determines what fluid is suitable for removing the flux. Non-rosin-based fluxes may be fairly easily cleaned through aqueous washing, although exposure of substrate boards and their components to water is something which all manufacturers would prefer to avoid, if given the choice.

Rosin-based fluxes are not removable with a water wash, and require more aggressive solvents that have environmental disadvantages. Despite the difficulty in cleaning printed circuit boards after assembly through use of rosin-based fluxes, such fluxes are more reliable and thus are used for military applications and other areas where greater reliability is required.

The combustible solvents now used to clean rosin-based flux residue generate flammable and environmentally undesirable vapors that must be safely contained, and require costly disposal methods because they cannot be drained into conventional sewer systems.

Chlorinated hydrocarbon solvents have been found to be useful for cleaning printed circuit boards soldered with rosin-based fluxes, but these solvents are toxic and not readily bio-degradable, and are, therefore, hazardous for a long period of time. Fluorocarbon solvents have also been found useful for this purpose. These solvents, however, when released to the atmosphere, destroy the ozone layer in the atmosphere and have, therefore, been banned from further production. Haves, et al., U.S. Pat. Nos. 4,640,719 and 4,740,247, disclose a new terpene solvent which is suitable for removing rosin-based fluxes from printed circuit boards. Unfortunately, terpene solvents are combustible.

Apparatus to contain and apply solvents for cleaning printed circuit boards can be generally classified into continuous systems and batch systems. Kishida, et al., U.S. Pat. No. 4,589,926, discloses a linear continuous system for cleaning printed circuit boards. The printed circuit boards are carried by a cassette which is placed in one end of the apparatus and advanced through zones within the apparatus. In one of the zones, liquid solvent is sprayed on the printed circuit board while brushes simultaneously scrub the board. The solvent is collected, vaporized, and distilled to remove impurities prior to being reused. Although this apparatus is suitable for the particular solvent used, namely "ARKLONE", a carbon fluoride 113, it is not practical for combustible solvents because solvent vapors can still enter the atmosphere from the entrance or the exit end of the apparatus, creating a fire hazard.

Batch systems have been devised such as shown in Kishida, et al., U.S. Pat. No. 4,643,774, for cleaning substrate. Kishida, however, immerses the substrate into an open wash liquid container. This allows wash liquid vapors to enter the atmosphere. Drying air is also directed at the substrate as they are removed from the wash liquid container, further forcing wash liquid vapor into the air.

Another batch cleaning system for using combustible solvents is disclosed in U.S. Pat. No. 5,027,841 to Breunsbach et al. This system is a closed loop system using only solvent to wash the printed circuit boards in a sealed chamber that is purged with inert gas before it is opened. In the closed loop system, solvent is reused and recycled until its useful properties are exhausted. Solvent is sprayed onto the boards to mechanically dislodge and dissolve contaminants. After the printed circuit boards are cleaned, they must be removed from the chamber and inserted in a separate apparatus for rinsing the remaining solvent off the boards. Although the inert gas purge is sufficient to eliminate any fire or explosion hazard, some solvent vapor escapes to the environment as the printed circuit boards are transferred to the rinse apparatus.

A printed circuit board cleaning apparatus which uses a first wash fluid and a second rinse fluid in a single chamber is shown in U.S. patent application Ser. No. 07/715,441, filed Jun. 14, 1991, by Breunsbach et al. In this system, a saponifier solution wash is sprayed onto the printed circuit boards and then drained from the chamber. A similar water rinse follows. Finally, a water and alcohol solution is sprayed onto the boards to be subsequently tested to determine cleaning effectiveness. This system does not, however, recycle or reuse the saponifier wash fluid or the rinse fluid. Only the cleanliness test solution is recycled for reuse.

The common use of alcohol-containing cleaning or testing solutions in the post-solder cleaning of printed circuit boards is a byproduct of the demise of CFC cleaning solutions, has created problems beyond those already mentioned above. Exposing a flux residue to alcohol creates a white residue which is unsightly, potentially degrading to the printed circuit board's operation, and very difficult to remove. This "white residue problem" is one recognized throughout the electronics industry and one which leads many manufacturers to continue using such CFCs as they can obtain, despite the indisputable deleterious environmental impact. Prior to the invention underlying this application, extensive, industry-wide research has failed to provide any means for both combatting the "white residue problem" while using non-CFC, alcohol-containing processing agents.

Regardless of the fluxes used, or the methods of cleaning completed printed circuit boards employed, it is imperative that the boards, in fact, be clean. In high precision electronic applications, not only is a high level of cleanliness necessary, but a method for verifying that level of cleanliness is often required.

The standard method for testing printed circuit board cleanliness is MIL-P-28809 ("MIL-SPEC test"). This test method presently involves measuring the resistivity of a known alcohol (typically isopropyl alcohol or "IPA") and water mixture, at a known temperature for a given printed circuit board area, before and after the IPA mixture is exposed to a "cleaned" printed circuit board. If the final rinse resistivity of the IPA mixture drops below 2M OMEGA/cm sup 3 the printed circuit board is considered contaminated and must be rejected. Information concerning this method can be found in any number of references, including: Batch Aqueous Cleaning—The Road to Ultra Clean printed circuit board Assemblies, Electronic Controls Design, Inc., 1987. An accepted and typical method and apparatus for carrying out a mil-spec test on electronic assemblies is disclosed in U.S. Pat. No. 4,023,931 to Wolfgram. It involves immersing the electronic assembly in a static pool of a mixture of deionized water and isopropyl alcohol.

The currently separate step of verifying cleanliness through the above-described IPA-based methodology adds time and expense to the manufacturing processes of printed circuit boards. This, in turn, increases the costs to the end-consumer.

SUMMARY OF THE INVENTION

It is an object of the present invention to provide a novel printed circuit board cleaning methodology which obviates the need for using environmentally hazardous chemicals in order to achieve acceptable levels of cleanliness.

It is an object of the present invention to provide a novel, effective, closed loop, non-CFC-based printed circuit board cleaning methodology.

It is an object of the present invention to provide a novel printed circuit board cleaning methodology which effectively cleans printed circuit boards soldered with both rosin-based and non-rosin-based fluxes.

It is an object of the present invention to provide a novel printed circuit board cleaning methodology which uses an environmentally benign solvent, yet does not create post-processing "white residue."

It is an object of the present invention to provide a novel printed circuit board cleaning methodology which uses a cleaning solution with a high flash point.

It is an object of the present invention to provide a novel printed circuit board cleaning methodology which, while conforming to the other objects stated herein, may use a cleaning solution with a low boiling point.

It is an object of the present invention to provide a novel printed circuit board cleaning methodology which uses a cleaning solution which is low-toxic.

It is an object of the present invention to provide a novel printed circuit board cleaning methodology which uses a cleaning solution which can be re-generated and, thus, used repeatedly.

It is an object of the present invention to provide a novel printed circuit board cleaning methodology which, in a single operation, simultaneously cleans printed circuit boards and permits monitoring of the cleanliness achieved.

It is an object of the present invention to provide a novel printed circuit board cleaning methodology which utilizes a single cleaning solution the resistivity of which is conducive to measurement as an indication of the cleanliness of printed circuit boards cleaned therewith.

It is an object of the present invention to provide a novel printed circuit board cleaning methodology which uses a cleaning solution: (1) which is non-toxic, (2) has a high flash point, (3) has a low boiling point, (4) cleans post-soldering residue from substantially most commercially available solder fluxes, (5) does not generate "white residue", (6) the resistivity of which is conducive to measurement as an indication of the cleanliness of printed circuit boards cleaned therewith, (7) is compatible with resin beds, and (8) is non-pernicious to printed circuit board components and substrates.

It is an object of the present invention to provide a novel printed circuit board cleaning methodology which affords substantially reduced cleaning solvents consumption when compared with currently available, non-CFC-based printed circuit board cleaning methodologies.

It is an object of the present invention to provide a novel printed circuit board cleaning methodology which permits long-term use without the need for disposal of waste products by its user.

It is an object of the present invention to provide a novel printed circuit board cleaning methodology the apparatus involved in the practice of which requires substantially less space than currently known equipment for cleaning printed circuit boards and monitoring their cleanliness, regardless of the underlying chemistries or apparatuses.

It is an object of the present invention to provide a novel printed circuit board cleaning methodology which obviates the need for a processing step, separate from the board cleaning step(s), for testing the cleanliness of a printed circuit board.

It is an object of the present invention to provide a novel printed circuit board cleaning methodology which permits the integration of the testing of a printed circuit board for flux bi-product ionic contamination with the cleaning process itself.

The printed circuit board cleaning methodology described hereafter satisfies each and every one of the aforementioned objects, whether or not such is explicitly stated hereafter. Applicant has, through exhaustive research and testing, and after numerous failures in using alternative chemistries or processing steps, derived a uniquely effective and beneficial methodology for cleaning printed circuit boards after the soldering or "re-flow" operation in the production thereof.

Applicant's methodology involves the use of a cleaning agent which, while available for other uses, has never heretofore been recognized in the electronics industry as a viable cleaning agent for printed circuit boards. The cleaning agent is propylene glycolmethyl ether acetate ("PMA") and 1-Propoxy-2Propanol Solvent Blend.

PMA is a solvent which has been found to effectively rid printed circuit boards of the contaminants remaining after the manufacturing step of soldering the components thereon. Unlike some or many presently available, non-CFC-based solvents, no "white residue" remains after using PMA. PMA is non-toxic, has a high flash point, has a low boiling point, is non-pernicious to printed circuit board substrate and components, is non-reactive to the ozone layer, and effectively cleans residues remaining after application of all widely used fluxes.

PMA is readily regenerated through passage through resin beds. Specific resins must be used in order to regenerate PMA, resins which are suitable for use with organic solvents. After extensive research and evaluation, Applicant discovered that the nonaqueous resins designated as "A-15" and "A-26" by their supplier, Rohm and Haas, Philadelphia, Pa., USA, perform very well as the solvent regenerating material for the claimed methodology. (U.S. Pat. No. 4,224,415.)

Of substantial significance is that PMA exhibits a resistivity which varies between measurable extremes, with a "clean" resistivity (the higher level of resistivity) of approximately 250–300 megaohms. The resistivity of PMA in its "clean state", unlike numerous other solvents tested by applicant like Axarel 2200 and Terpenes, falls within a measurable range (albeit requiring especially modified equipment as will be described below). Thus, PMA lends itself to simultaneously serving as both a safe and effective cleaning agent and as a measurable indicator of board cleanliness.

Applicant's methodology involves the immersion of printed circuit boards in a whirlpool bath-like cleaning chamber in which fluid jets of PMA are directed against the boards from a plurality of jet nozzles. The PMA travels through an endless cycle in the cleaning apparatus driven by one or more fluid pumps. The pumps circulate the PMA from the cleaning chamber past resistivity sensors to resin beds which remove the ionic contaminants from the PMA. The regenerated PMA is then returned to the cleaning chamber through the jet nozzles to begin another circuit.

In the preferred mode of Applicant's methodology, the cleaning process continues until the resistivity of the PMA rises to a predetermined level, thus indicating that the boards have, accordingly, reached the chosen level of cleanliness.[1]

[1] Onsager, Phys. Z. 28, 277 (1927); P. W. Atkins, "Physical Chemistry", 3rd., Chap. 27, Freeman, N.Y. (1986).

As indicated, special equipment was adapted by Applicant for use in the subject methodology. Commercially available resistivity meters only measure up to approximately 50 megaohms, and even these are quite rare. Numerous contacts with resistivity meter suppliers revealed a consistent incredulity as to the need for measuring resistivity even as high as 50 megaohms. Applicant surmised, without the aid of any of the manufacturers, that a 50 megaohm resistivity meter having a 0.1 cell constant (such as is available from Thornton Associates, of Waltham, Mass., USA could be modified to measure up to 500 megaohms (the range predicted to be necessary if the solvent families under consideration were to be useful as cleanliness indicators) by substituting a 0.01 cell constant. Such a modification proved to be effective, and produced a meter which could measure the extremes in resistivity of cyclically regenerated PMA as used to clean printed circuit boards.[2]

[2] D. P. Shoemaker, "Experiments in Physical Chemistry", 5th ed., Chap. VIII, page 254, McGraw-Hill (1989).

The cleaning apparatus envisioned by Applicant for use of this methodology includes computer-based monitoring and control features which actuate the cleaning solution circulation pump(s) upon initiation of a cleaning cycle, and terminates pump operation when the resistivity of the PMA is measured to reach a pre-selected level. Although any number of control systems could be readily interfaced with the resistivity measuring means needed for Applicant's methodology, Applicant has used a Thornton 200 CR Process Controller system which is available from Thornton Associates, of Waltham, Mass., USA.

Once generally accepted correlations are established between specified board cleanliness and resistivity levels of the PMA in which such boards are emersed (comparable to the MIL-SPEC test), post-cleaning tests for board cleanliness such as must now be performed in many board production programs will be relegated to history. Applicant has already established through exhaustive analysis that immersing printed circuit boards in an agitated body of PMA produces a level of cleanliness which will meet all presently prescribed specifications. Thus, the interface between the resistivity measuring means and the cleaning system pump(s) is less an actual test than it is a "batch timer" for insuring that the cleaning process has continued for so long as is necessary to achieve the inevitable result thereof.

To the extent that practitioners of Applicant's methodology wish to maintain records which indicate the cleanliness of boards produces at their facilities, the computer-based control system mentioned above can be adapted by well-known means to create a record of the processing time for each cleaning operation and the resistivity levels over the course of processing. Such records would constitute a valuable element of any quality control monitoring program and could help identify any production problems which generate unusually high levels of board contaminants.

Inasmuch as the resistivity levels which indicate satisfactorily cleaned circuit boards will vary according to the cumulative surface area of the boards cleaned in any given batch, the preferred embodiment of the cleaning system for use in Applicant's methodology will have means by which the user may adjust the level of resistivity at which the system terminates a cleaning cycle.

Suitable interfaces between monitoring equipment and apparatus controls such as are suggested for the cleaning apparatus described above, as well as software schemes for permitting the recording of measured parameters and adjustment of value limits for measured parameters (resistivity, for example) are readily available to the industry. The specific design features of such control and monitoring systems are not themselves features of the subject invention, although the use of generically defined such systems is an important feature of Applicant's invention, at least in its preferred embodiment. Thus, detailed descriptions of computer hardware or software schemes for controlling and monitoring conditions in cleaning apparatus are not necessary for an enabling disclosure of the subject invention.

The economies and positive environmental impact of using Applicant's methodology in lieu of presently available alternatives are independently momentous, and in combination are unparalleled in this industry. The preferred embodiment of the apparatus used in practicing the subject methodology includes resin bed containers which are connected to the remainder of the cleaning apparatus through use of "quick disconnect" junctures. Thus, a user will be able to exchange fresh resin bed containers for saturated ones, for regeneration by an off-site service. A user need not, therefore, be involved at all in the disposal of any waste products whatsoever. This, in turn, obviates the need for waste disposal permits any many environmental inspections and compliance reports. As already mentioned, the PMA or equivalent solvent used in this methodology is as environmentally benign as any solvent imaginable.

Because the PMA used in Applicant's methodology is continually regenerated, and is used over and over again, the only consumption of solvent is through evaporation. Evaporation, in turn, is impeded by a substantially air-tight cleaning chamber closure which traps most vapors produced during use of the preferred embodiment of the cleaning apparatus. It is estimated that the cost of purchasing a cleaning apparatus suitable for use in practicing Applicant's methodology would be off-set completely once the same number of circuit boards are cleaned as would require the consumption of three drums of CFC solvents (a mere two or three months for most major circuit board manufacturers).

Finally, obviating the need for post-cleaning tests for cleanliness reduces equipment and labor costs, as affords an opportunity for boosting circuit board production rates.

DETAILED DESCRIPTION OF PROCESSING PARAMETERS

The following sets forth certain, more specific parameters for the practice of Applicant's methodology:

Applicant's methodology involves three major components: (1) dual process control capabilities (time mode/contamination level mode), (2) solvent recovery from ionic contamination, and (3) nature of the solvent (chemical and physical properties). The process can be summarized as follows: materials to be cleaned are placed in a process tank, which is subsequently filled with clean solvent (free of ionic contamination). The level of ionic contamination of the materials can be monitored by conductivity detection of the solution as ions are removed from material surfaces and dissolved in the solvent. Depending on the nature of the materials and of the ions present, there will be a point in time when the conductivity of the solution reaches a stable level. This is the point when it can be assumed most of the ionic contamination amount has been removed from the material surfaces. The following step will be a recirculation of the contaminated solution through an ion exchange resin. The delta (change) in conductivity is continuously monitored until it reaches the desirable level. In effect, the materials are rinsed at this point with the regenerated solvent (free of ionic contamination). This provides an analytical assurance of cleanliness of the materials.

1. Process Control

The process can be controlled by conductivity detection of ions in solution.

| | |
|---|---|
| $L = K A/l$ | Where L: conductance, K: constant specific of the material (conductivity), A: cross sectional area, l: distance |
| $L = 1/R$ | Where R: resistance |
| $R = (1/K)(1/A)$ | Where 1/A: cell constant, (1/K): resistivity |

Resistivity = Resistance/cell constant

The Resistance of a solution can be measured by a resistivity/ conductivity controller in which a variable capacitance is placed in a Wheatson Bridge. A high frequency alternating current is transmitted to a cell electrodes immersed in solution. The capacitance of the solution is then counter balanced by the variable capacitance. Obviously, as the number of ions and their mobilities in solution increases, the resistivity decreases (and vice versa).[3] The resistivity controller can be as sophisticated or as simple as one desires. A sophisticated controller can be programmed to transmit measurement data and to control the process by electrical relays.

[3] P. W. Atkins, "Physical Chemistry", 3rd., Chap. 27, Freeman, N.Y. (1986)

For some applications, a time mode process control may be desirable, in which the materials are cleaned and rinsed in a preset time period regardless of resistivity/conductivity readings.

Resistivity v. Ionic Concentration Relation

| | |
|---|---|
| $\Lambda = \Lambda_o(1 - \beta \sqrt{c})$ | $\Lambda$ = conductivity |
| $\Lambda = \Lambda_o - \Lambda_o \beta \sqrt{c}$ | $\Lambda_o$ = conductivity at infinite dilution |
| $\Lambda = \dfrac{1}{R}$ | $\beta$ = molecular energy constant |
| | $R$ = resistivity |
| | $c$ = ionic concentration |
| $c = \left(\dfrac{1}{R} - \alpha\right)^2 /\lambda^2$ | $\alpha$ and $\lambda$ = are empirical constants, characteristic of a specific solvent-solute solution |

2. Solvent Recovery/Ion Exchange

Conventional ion exchange polymer materials (i.e., polystyrene/divinylbenzene crosslinked) are not suitable for "harsh" organic solvents because of material compatibility and their inability to effectively undergo ion exchange in non-aqueous media (although they work relatively well with low molecular weight alcohols).

After extensive research in this area, including inorganic ion exchange agents, it appears that ion exchange polymers such as the ones marketed by Rohm and Haas in their A-15 and A-26 products numbers are clearly suitable for ion exchange techniques in non-aqueous media. For electronic packaging cleaning applications (mainly flux ionic contamination), consistent and repeatable results have been attained (extensive laboratory experiments have been performed in which the ionic contamination removal from non-aqueous solvent has been detected quantitatively by resistivity/conductivity measurements).

Due to the proprietary nature of these resins (Rohm and Haas A-15, A-26, A-21, A-29, etc.), the polymeric structure/composition is unknown to Applicant at this point. The following illustration provides an insight of the ion exchange mechanism:

CATION EXCHANGE:

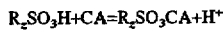

ANION EXCHANGE:

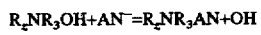

3. Nature of the Solvent (Chemical and Physical Properties)

Given a series of physical, chemical, environmental, and engineering constraints of the cleaning process, a solvent blend has been deliberately designed while maintaining the following characteristics:

a. Effective in removing (dissolving) Rosin fluxes without traces of "white residue".

8 Compatible with hardware equipment and components (specially resin cartridges).

Conductive with a measurable specific resistivity in its pure state and able to produce solvent-ion and ion-ion interactions that do not compromise resistivity measurements as a function of the ionic concentration.

d. Low boiling point (this is essential for fast air drying).

e. Non-flammable (combustible is acceptable, F.p.>107° F.).

f. Chemically compatible with PCB components.

g. Non-toxic (preferably with a health hazard rating of 1 or 0).

A homogenous, thermodynamically stable blend of PMA (Propylene Glycol Methyl Ether Acetate) and PNP (Propylene Glycol Propyl Ether) is particularly suitable for Applicant's methodology. This blend can be easily modified in order to vary specific resistivity by the addition of smaller highly polar compounds in small concentrations up to 5% (i.e., water, alcohols). In addition, small amounts of surfactants may be added in order to lower the surface tension even further (in most cases, this will not be necessary). This blend will effectively dissolve most organic flux residues as well as inorganic contaminants due to the dual organic/aqueous continuous phase.

In some cases, Applicant's close loop process can be modified by using other solvents that do not necessarily meet the mentioned characteristics. For example, a separate water rinse can be incorporated into the process along with a hot air drying device in order to provide effective cleaning.

Although the invention has been described with reference to specific embodiments, this description is not meant to be construed in a limited sense. Various modifications of the disclosed embodiments, as well as alternative embodiments of the inventions will become apparent to persons skilled in the art upon the reference to the description of the invention. It is, therefore, contemplated that the appended claims will cover such modifications that fall within the scope of the invention.

CONCLUSION

The significance and uniqueness of the process resides in the following facts:

a. A cleaning process can be monitored and controlled while in operation in both time and contamination level mode.

b. The cleaning solution is regenerated efficiently after each cycle (ionic contamination is removed). The obvious advantage is that every cleaning cycle the solvent is clean. Even though some non-ionic contaminants are not trapped by ion exchange or filtration, an additional solvent recovery system can be incorporated (i.e., distillation, membrane ultrafiltration, osmosis, etc.) for that purpose; this additional system can be used periodically (i.e., once a week) as opposed to every cycle.

c. The practicality of the chemical disposal is evident. Exhausted ion exchange resins can be recycled for reuse or disposed as solid waste (some amount of solvent will be "absorbed" in the resin cartridge).

d. The cleaning efficiency of the solvent for reflowed flux removal is outstanding.

e. The solvent compounds contain no halogen atoms.

f. The solvent has a very low level of toxicity (health hazard 1).

g. The overall process can lower cleaning costs because of reduced chemical replacement cost and disposal quantities.

I claim:

1. A method for cleaning electronic components comprising the steps of:

applying a cleaning solution comprising propylene glycolmethyl ether acetate to said electronic components;

through use of resistivity measuring means, measuring resistivity of said cleaning solution at a plurality of times during said application of said cleaning solution to said electronic components;

terminating said application when said resistivity measuring means indicates that the resistivity of said cleaning solution after contact with said electronic components has risen from a first resistivity level at the beginning of said application to a predetermined second resistivity level which indicates that a corresponding level of component cleanliness has been attained.

2. The method of claim 1 wherein pump means, conduit means and jet nozzle means are configured for effecting said application of said cleaning solution to said electronic components, and said pump means is operably interfaced with said resistivity measuring means whereby operation of said pump means is discontinued when said resistivity measuring means indicates said cleaning solution after application to said electronic components has reached said second resistivity level.

3. A method for cleaning electronic components comprising the steps of:

cyclically applying of a first measure of a cleaning solution comprising propylene glycolmethyl ether acetate to said electronic components;

through use of resistivity measuring means, measuring resistivity of said cleaning solution at a plurality of times during said cyclical application;

cyclically passing of said cleaning solution through ion exchange means for removing contaminants yielded from said electronic components;

terminating said cyclical application when said resistivity measuring means indicates that resistivity of said cleaning solution as it flows from said components prior to said ion exchange means has risen from a first resistivity level at the beginning of said cyclical application to a predetermined second resistivity level which indicates that a corresponding level of component cleanliness has been attained.

4. The method of claim 3 wherein pump means, conduit means and jet nozzle means are used for effecting said cyclical application, and said pump means is interfaced with said resistivity measuring means whereby operation of said pump means is discontinues when said resistivity measuring means indicates reaching said second resistivity level.

* * * * *